United States Patent [19]

Williams

[11] Patent Number: 4,530,107

[45] Date of Patent: Jul. 16, 1985

[54] SHIFT REGISTER DELAY CIRCUIT

[75] Inventor: Marshall Williams, Fremont, Calif.

[73] Assignee: Ampex Corporation, Redwood City, Calif.

[21] Appl. No.: 418,866

[22] Filed: Sep. 16, 1982

[51] Int. Cl.[3] .................. H03K 5/13; H03K 21/36; H03K 23/00; G11C 19/00

[52] U.S. Cl. ..................... 377/44; 307/602; 307/603; 377/47; 377/52; 377/54

[58] Field of Search ............ 377/44, 47, 52, 54, 377/64, 66, 77, 78; 307/602, 603

[56] References Cited

U.S. PATENT DOCUMENTS

| | | | |
|---|---|---|---|
| 3,633,113 | 1/1972 | Grubel et al. | 307/602 X |
| 3,646,371 | 2/1972 | Flad | 377/52 X |
| 3,728,635 | 4/1973 | Eisenberg | 377/44 X |
| 3,840,174 | 10/1974 | Craft | 377/44 X |
| 4,137,568 | 1/1979 | Dlugos | 377/47 X |
| 4,277,693 | 7/1981 | Hoekman | 377/44 X |
| 4,433,426 | 2/1984 | Förster et al. | 377/54 X |

Primary Examiner—Larry N. Anagnos
Attorney, Agent, or Firm—Joel D. Talcott; Elizabeth E. Strnad

[57] ABSTRACT

The clock signal to a fine delay shift register is divided by the number of fine delay bits for application to a coarse delay shift register such that two serially connected shift registers can provide a range of delays equivalent to a shift register having a number of bits equal to the product of the bits of the two shift registers.

16 Claims, 1 Drawing Figure

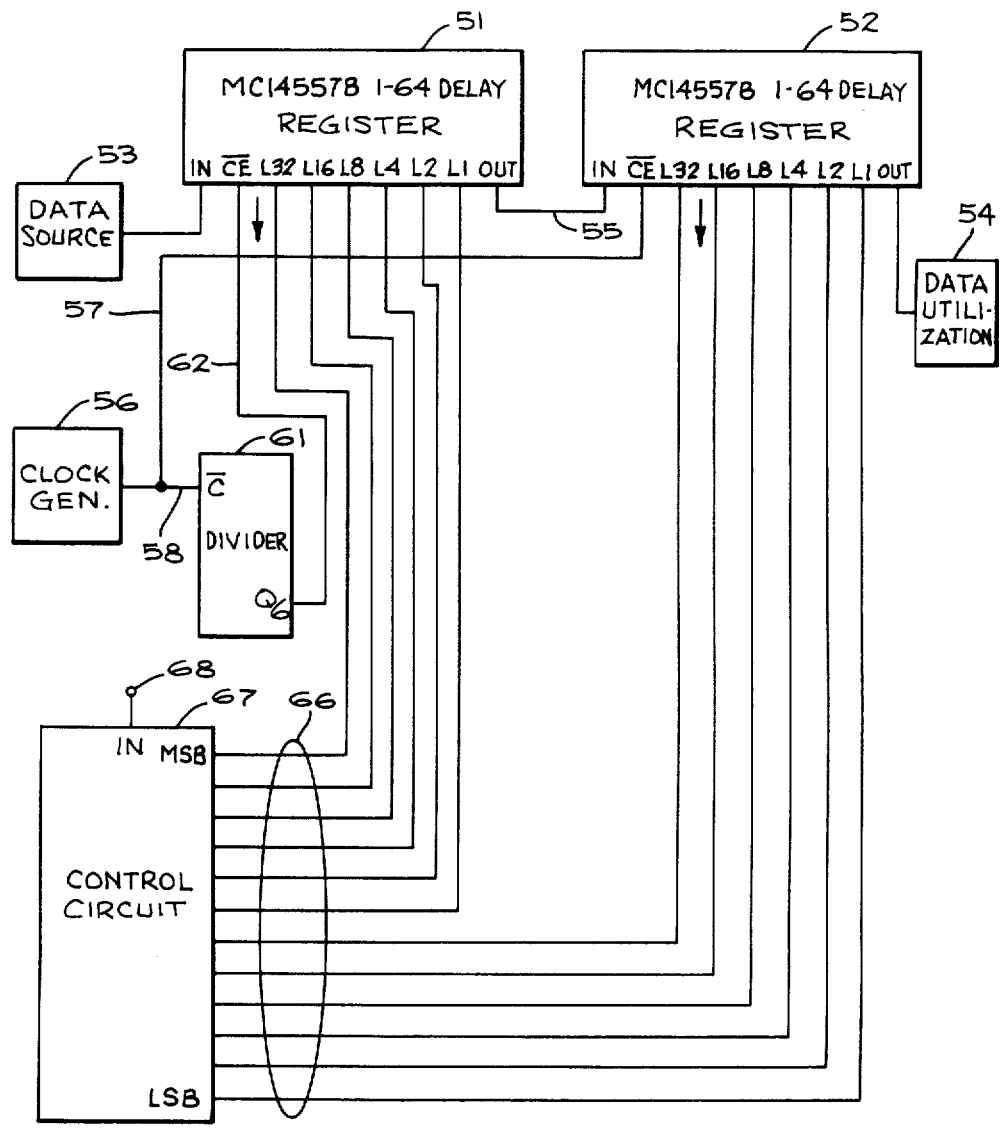

SHIFT REGISTER DELAY CIRCUIT

This invention relates to a delay or phase adjustment circuit and, more particularly, to a delay circuit for use in systems requiring a wide range of delay times for complex wave forms.

Many types of delay circuits and delay elements have been used for the purpose of receiving an information input and producing an information output which is generally the same as the input except that the output is delayed by time which is controlled by the delay circuit or element. Certain delay circuits are capable of providing programmable delays, whereby the time or phase difference between the circuit input and circuit output may be adjusted in accordance with the requirements of related circuitry.

One of the most widely used delay devices is the shift register which is a digital delay device which may readily be programmed for various delay lengths in accordance with a clocking input. Each clock pulse shifts the data in the shift register by one bit, finally exiting after traversing the total number of bits set for delay in the shift register. Thus, for example, a 64 bit shift register is capable of delaying data for 64 clock pulses. Of course, a lower delay number may result from the application of control signals to suitable terminals on the shift register in a well known manner. The length of each delay count is controlled by the period of the clock. Thus, by changing the period or frequency of the clocking input, the delay time provided by a shift register may be adjusted. However, extending this delay time also has the result of reducing the precision with which delay times can be controlled. The use of higher frequency clock will provide finer control of delay times but will also result in a much shorter maximum delay time being available through the use of the shift register.

Accordingly, delay circuits have been constructed utilizing a plurality of shift registers connected in series so that a higher data resolution may be provided and greater delay times can result from the use of multiple shift registers. By such structure, a delay may be provided which is the sum of the delays of the shift registers. However, as can be recognized, if a wide range of delay is required, from a very small delay to a very large delay, and it is desired to provide a high resolution of delay times, a substantial number of shift registers must be used. This produces problems both in the need for additional circuit components and due to complex control circuits being necessary to provide the required control for the large number of shift registers.

In accordance with this invention, a shift register circuit comprises a plurality of shift registers in an arrangement which provides both a wide range of delay times and a high resolution of delay times wherein the shift registers are clocked at different rates such that the total delay available by the combination is equivalent to a shift register having a number of delay bits equal to the product of the delay bits of the two shift registers rather than the sum thereof.

To such end, a clock signal is generated in synchronism with the data signal to be delayed or phase adjusted and having a frequency which is established in accordance with the delay resolution desired. This clock signal is supplied to control the final stage of the plurality of cascaded shift registers. The clock signal is then frequency divided by a number substantially equal to the number of delay bits of the trailing shift register for application to the preceding shift register. For example, where two cascaded 1-to-64 bit variable shift registers are utilized, the frequency of the clock signal for the first shift register is 1/64 of that of the second register. With such an arrangement, the variable delay extends from 65 to 4,160 delay units of the length of the second register clock pulse, whereas utilization of such shift registers in the manner provided by the prior art would produce an available delay range of from 2 to 128 of such clock pulses.

In accordance with this invention, any number of shift register stages desired may be provided to produce an extremely wide range of available times with high delay resolution by frequency dividing the clock signal for application to each preceding register by the number of delay bits in its trailing shift register. The multistage delay circuit provided thereby will produce a maximum delay range equivalent to that which would be provided by a shift register having a number of delay bits equal to that of the product of the shift registers, and a delay resolution equal to that of the fine delay stage. For example, three 0-to-63 bit shift registers in accordance with the present invention are equivalent to a 0-to-262,143 bit shift register having a delay resolution equal to that of the finest delay stage and with a data resolution equal to that of the coarsest delay stage, i.e., 1/4096 of clock.

These and other advantages of the present invention will be more readily apparent when described in accordance with the appended drawing.

BRIEF DESCRIPTION OF THE DRAWING

The sole FIGURE is a blockdiagram of a delay circuit in accordance with the present invention.

DETAILED DESCRIPTION

Referring now to the drawing, first and second shift registers 51 and 52 are illustrated, each having an input terminal (IN), a clock terminal (CE), a plurality of length control terminals (L32, L16, L8, L4, L2, and L1) which control the number of delay bits through which data from the input terminal IN will flow, in a well known manner, and an output terminal (OUT). These shift registers may be identical or different in the number of delay bits contained in each. However, for the purposes of this description, each will be considered to be a 1 to 64 bit variable shift register such as Motorola Part Number MC14557B.

The number of delay bits selected is equal to the sum of the L numbers of the enabled length control terminals plus one, inasmuch as this type of shift register always provides a minimum delay length of one, it being understood that a delay length of one describes a delay of the data through one bit cell for a length of time equal to the period of the clock pulse applied to the register.

For simplification, the drawing has been limited to illustrating two shift registers. However, it should be readily understood that additional shift registers may be provided. The input terminal IN of the first register 51 is connected to a source 53 of data to be delayed or phase adjusted and the output terminal OUT of the second register 52 is connected to appropriate data utilization circuits 54. A suitable jumper conductor 55 connects the output terminal OUT of the first register 51 to the input terminal IN of the second register 52 such that the data from the source 53 flows serially through the register stages before transmission to the data utilization circuitry 54.

To provide clock pulse inputs to the two shift registers 51 and 52, a clock generator 56 is provided to develop a train of pulses preferably having negative going transitions thereof being in synchronism with transitions of the data waveform in the second shift register 52. The clock generator 56 has its output connected to the clock terminal $\overline{CE}$ of the second register 52 by a conductor 57.

The output of the clock generator 56 is also applied through a conductor 58 to an input terminal $\overline{C}$ of a divider 61 which has an output terminal Q6 connected by a conductor 62 to the clock input $\overline{CE}$ of the first shift register 51.

In accordance with this embodiment, wherein the second shift register 52 is a 1-to-64 bit delay register, divider 61 is a divide-by 64 unit divider and produces pulses having negative going transitions of the pulse train in synchronism with transitions of the data waveform applied to the input terminal IN of the first shift register 51.

As has been indicated previously, the length of the delay provided by each of the shift registers 51 and 52 is a function of the period of the clock pulse applied to the clocking input $\overline{CE}$ and the number of bits of each shift register which is called into play by the application of controlled inputs to the L32, L16, L8, L4, L2, L1 control terminals thereof. In the preferred embodiment, these inputs are provided through a series of conductors 66 connected between the control terminals and a control circuit 67 which may contain a microprocessor (not shown) or other means to respond to a command input applied through an input terminal 68 to produce suitable signals to the shift register control terminals.

Because of the nature of the shift register structure of this invention, it is possible to use a conventional microprocessor output wherein a 12 bit word is applied to the shift registers with the least significant bit (LSB) being applied to the L1 terminal of shift register 52 and the most significant bit (MSB) being applied to control terminal L32 of the first shift register 51 with the weighting factor between adjacent bits being 2 to 1 without the need for any discontinuity between the bits applied to the first and second shift registers, that is the weighting factor between the bit applied to control terminal L1 of the first shift register 51 being a factor of 2 times the weighting factor of the bit applied to the control terminal L32 of the second shift register 52. It will be readily apparent that problems of the prior art related to the need to convert the output words of microprocessors into special codes with the use of enable lines and the like may be avoided and a microprocessor output or other suitable binary code applied directly to the shift registers to provide complete control of the length of delay.

The control circuit 67 is preferrably suitably programmed to issue signals continuously to the appropriate lines 66 so that the registers 51 and 52 provide the desired delay of the input data from the data source 53 for supply to the data utilization circuitry 54. It is to be noted that the number of . output lines of the control circuit 67 may not be compatible with the number of control input terminals of the two registers 51 and 52 and in this event an interface such as latch circuitry (not shown) may be provided.

In controlling delays provided by shift registers 51 and 52, it must be remembered that each of the shift registers disclosed in this description has an inherent one pulse delay when none of the control terminals are energized. Of course, shift registers providing no delay unless at least one control terminal is energized are well known and could be substituted if desired. Because divider 61 produces one output clocking pulse to shift register 51 for every 64 input pulses it receives, shift register 51 produces a delay for each clocking pulse which is 64 times the length of the delay provided by one clocking pulse applied to the shift register 52. Thus, considering a delay of "one" to be equivalent to a clock pulse applied by clock generator 56 to the clock input of shift register 52, shift register 52 provides a delay of from 1 to 64 and shift register 51 provides a delay of from 64 to 4096, so that the maximum delay available with this combination of shift registers is 4160. By suitably controlling the delay provided by each shift register through the application of control signals to the terminals L1–L32 of each, any delay from a minimum of 65 to a maximum of 4160 may be provided through the use of only two shift registers, whereas in accordance with the prior art, the same two shift registers would be capable only of producing a range of delays of from 2 to 128 and with identical delay resolution.

It will be readily apparent that by the use of shift registers having a delay range of from 0 to 63, a delay range of from 0 to 4095 would be available. It can be seen that the first shift register 51 serves as a "coarse" delay and the second register as a "fine" delay.

If it were desired to provide a delay of, for example, 3250, the shift registers 51 and 52 must be caused to produce a delay of 3185 greater than the inherent delay of 65 which occurs when there is no controlled input to the terminals of the shift registers 51 and 52. Accordingly, it would only be necessary to produce an output of the control circuit 67 along conductors 66 being the binary word for the number 3185. Thus, reading from the most significant bit to least significant bit, an output of the control circuit 67 of 110001110001 would result in the desired delay of 3250 clock pulses of the fine shift register 52.

As was stated above, the two cascaded shift register combination was selected for description for the reason of simplicity. The same principles, however, are applicable for combinations of more than two registers where more delay is desired. For example, three such 1-to-64 bit cascaded variable shift registers may be utilized with the second register being clocked at 1/64 of the rate of the third register and the first register being clocked at 1/64 of the rate of the second register (1/4096 of the rate of the first register) for a much longer delay capability. The resulting circuit will be equivalent to a 262,144 bit shift register clocked at the clocking rate of the fine shift register and having its delay resolution while having the data resolution of the coarse shift register. With 1-to-64 bit registers, a maximum delay of 266,304 and a minimum delay of 4161 are available.

Also, it is to be noted that the shift registers need not be of the same number of bits. As long as the clock signal to each register is divided by a number equal to the number of bits of its succeeding register, a full range of delay values will be available.

I claim:

1. A method of delaying a data signal through a coarse delay means having a preselected number of delay counts and a fine delay means serially connected to said coarse delay means and having a predetermined number of delay counts, said method comprising the steps of:

applying a clock signal to said fine delay means having a frequency for controlling the duration of said fine delay means counts; and applying a clock signal to said coarse delay means for controlling the duration of said coarse delay means counts, the ratio of said fine delay means clock signal frequency to said coarse delay means clock signal frequency being substantially equal to said predetermined number of fine delay means counts.

2. The method of claim 1, including the additional step of:

selectively controlling the number of delay counts of said coarse and fine delay means.

3. The method of claim 1 wherein said step of applying a clock signal to said coarse delay means comprises:

receiving said fine delay means clock signal;

frequency dividing said clock signal by the number of delay counts in said fine delay means to produce a coarse delay means clock signal; and applying said coarse delay means clock signal to said coarse delay means.

4. A delay circuit comprising:

coarse delay means having a preselected number of delay counts;

fine delay means having a predetermined number of delay counts;

means for conveying data serially through said coarse delay means and said fine delay means;

means for producing a fine clock signal having a frequency for controlling the duration of said fine delay means counts; and means for producing a coarse clock signal having a frequency for controlling the duration of said coarse delay means counts, the ratio of said fine clock signal frequency to said coarse clock signal frequency being substantially equal to said predetermined number of fine delay counts.

5. The delay circuit of claim 4 wherein said preselected number of coarse delay counts is equal to said predetermined number of fine delay counts.

6. The delay circuit of claim 4 wherein said preselected number of coarse delay counts is unequal to said predetermined number of fine delay counts.

7. The delay circuit of claim 4 wherein said coarse delay means has input and output terminals, said fine delay means has input and output terminals and said data conveying means comprises:

means for connecting said coarse delay means input terminal to a source of data;

means for connecting said fine delay output means terminal to data utilization means; and means for coupling said coarse delay means output terminal to said fine delay means input terminal.

8. The delay circuit of claim 4 wherein said coarse clock signal producing means comprises means for receiving said fine clock signal, dividing the frequency of said fine clock signal by the number of delay counts of said fine delay means to produce said coarse clock signal, and applying said clock output to said coarse delay means.

9. The delay circuit of claim 4 wherein delay counts of said fine delay means and said coarse delay means may be selectively enabled or disenabled and including means for controlling the number of enabled delay counts of said fine delay means and said coarse delay means.

10. The delay circuit of claim 9 wherein each of said fine delay means and said coarse delay means has a plurality of control terminals, and said control means includes means for selectively applying a control signal to said control terminals.

11. The delay circuit of claim 10 wherein said control signal is a binary word.

12. The delay circuit of claim 11 wherein:

each of said delay means control terminals has a value weighting factor;

the value weighting factor for each more significant control terminal is two times the value weighting factor of its next least significant control terminal; and the value weighting factor of the least significant coarse delay means control terminal is two times the value weighting factor for the most significant fine delay means control terminal.

13. The delay circuit of claim 4 wherein said coarse delay means comprises a shift register and said fine delay means comprises a shift register.

14. The delay circuit of claim 13 wherein said predetermined number of counts is 64.

15. The delay circuit of claim 14 wherein said preselected number of counts if 64.

16. The delay circuit of claim 4, further comprising:

additional delay means; and means for producing an additional clock signal having a frequency for controlling the duration of said additional delay means counts, the ratio of said coarse clock signal frequency to said additional clock signal frequency being substantially equal to said preselected number of coarse delay counts.

* * * * *